United States Patent [19]
Gdula et al.

[11] 3,925,107
[45] Dec. 9, 1975

[54] METHOD OF STABILIZING MOS DEVICES

[75] Inventors: Robert A. Gdula, Pleasant Valley; Stanley I. Raider; Martin Revitz, both of Poughkeepsie, all of N.Y.

[73] Assignee: International Business Machines Corporation, Armonk, N.Y.

[22] Filed: Nov. 11, 1974

[21] Appl. No.: 522,794

[52] U.S. Cl. .................. 148/1.5; 148/187; 357/23; 357/52

[51] Int. Cl.[2] ........................................ H01L 21/324

[58] Field of Search ......... 148/1.5, 187; 357/23, 52; 117/201

[56] References Cited

UNITED STATES PATENTS

| | | | |
|---|---|---|---|
| 3,290,180 | 12/1966 | Baird et al. | 148/1.5 |
| 3,547,717 | 12/1970 | Lindmayer | 148/187 |
| 3,591,423 | 7/1971 | Kawamura et al. | 148/1.5 |
| 3,615,873 | 10/1971 | Sluss, Jr. | 148/1.5 |
| 3,641,405 | 2/1972 | Brown et al. | 148/1.5 X |
| 3,658,678 | 4/1972 | Gregor et al. | 357/23 X |

*Primary Examiner*—L. Dewayne Rutledge
*Assistant Examiner*—J. M. Davis
*Attorney, Agent, or Firm*—Wolmar J. Stoffel

[57] ABSTRACT

The fixed charge in an $SiO_2$ dielectric layer for an MOS device is reduced by annealing the device after the $SiO_2$ gate dielectric layer has been formed by thermal oxidation to a thickness less than 500 Angstroms wherein the annealing is accomplished in an argon or other Group VIII gas atmosphere at a temperature of at least 900°C for at least ten minutes.

8 Claims, 4 Drawing Figures

METHOD OF STABILIZING MOS DEVICES

BACKGROUND OF THE INVENTION

This invention relates to stabilizing metal oxide silicon devices and in particular to an annealing operation performed during fabrication of MOS devices for the purpose of improving stability.

It is well known in the art that when the surface of a silicon wafer is oxidized in a high temperature oxidizing atmosphere, a positive charge develops near the oxide silicon interface. This charge causes the device to become unstable under the influence of a gate bias. The theory that has been postulated to explain the presence of the fixed charge is discussed in "Characteristics of the Surface State Charges of Thermally Oxidized Silicon" by Deal, Sklar, Grove and Snow, Solid State Science, March 1962. Basically, the theory is that the fixed charge exists at the silicon dioxide interface because of a stoichiometric unbalance of silicon and oxygen atoms. The shortage of oxygen atoms at the interface is due to the resistance to diffusion of the oxygen to the interface for the oxidation reaction, which results in a net positive charge. Annealing techniques to minimize this fixed charge are known to the prior art. In these annealing techniques, the gate oxides are conventionally exposed to a high temperature anneal in nitrogen or other molecular gas. This technique is disclosed in U.S. Pat. No. 3,615,873. Such anneal techniques do reduce the fixed charge level in a gate dielectric when the gate dielectric has a relatively great thickness, greater than 500 Angstroms. However, when thin gate oxide films are annealed in nitrogen or other molecular gas, it is noted that the fixed charge is reduced initially but with further annealing the charge increases. Thus, thin gate oxides cannot be stabilized by annealing in nitrogen. Annealing to reduce and stabilize the fixed charge in oxygen atmospheres is not successful because the stoichiometric unbalance of silicon and oxygen ions persists with further oxidation even though the location of the interface is changed. Further, exposure of the device to an oxygen atmosphere causes further build-up of the dielectric layer which is not desired.

SUMMARY OF THE INVENTION

An object of this invention is to provide a method for producing and stabilizing the gate dielectric of an MOS device.

Another object of this invention is to provide a technique for reducing and stabilizing the fixed oxide charge in a gate dielectric layer of an MOS device without degrading the layer.

These and other objects of the invention are achieved by this method for fabricating and stabilizing the gate dielectric layer wherein a layer of silicon dioxide having a thickness of less than 500 Angstroms is grown on at least the gate region of the device by thermally oxidizing the monocrystalline silicon device substrate, and the resultant device is annealed in an inert gas atmosphere at a temperature of at least 900°C for at least ten minutes.

DESCRIPTION OF THE PREFERRED EMBODIMENTS

Figure 1:
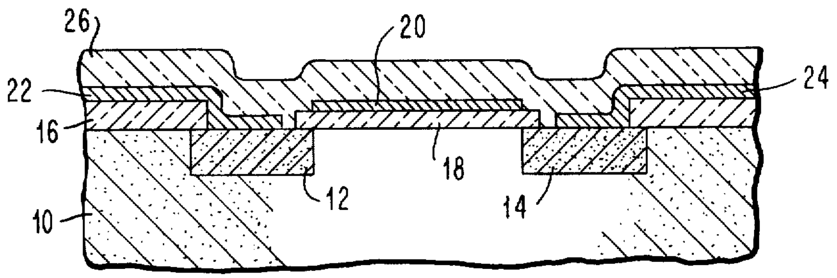
FIG. 1 is a cross-sectional view in elevated section depicting the structure of a typical field effect transistor.

In the fabrication of field effect transistors, important objectives are the forming of a suitable gate dielectric layer which will have stable threshold voltage characteristics and also be relatively thin in order to provide a low threshold voltage. The gate dielectric must be relatively uncontaminated in order to provide a stable threshold voltage. The techniques for forming a suitable layer to meet these objectives have been the subject of much study, experimentation, and discussion.

A problem of particular concern is the reduction of "fixed charge" at the silicon-dielectric gate interface. "Fixed charge" has been characterized as a positive charge that is present in the near vicinity of the silicon-gate dielectric interface. These charges, within the gate oxide which have generally been found to be positive, induce a negative charge in the silicon gate region and thereby lead to the tendency of thermally oxidized silicon surface to be N-type. In general, surface state charge is reproducible for a given set of conditions. The density of the charge is independent of the impurity concentration in silicon and of the oxide thickness over a wide range, and its density is independent of band bending or surface potential in the silicon over at least the middle 0.7ev of the energy gap. The "fixed" or "oxide" charge is believed to result from a stoichiometric unbalance of silicon and oxygen atoms in the interface region. In theory at this interface, the concentration of the oxygen atoms diffusing from the surface is lowest at this interface. The excess of silicon atoms results in a net positive charge.

It is well known that annealing will reduce the fixed charge in an oxide gate dielectric on a silicon body. Typically, the anneal is done in an $N_2$ atmosphere at a temperature on the order of 1,000°C for a time on the order of one hour. Annealing in an inert gas ambient such as argon or helium has been suggested. When the anneal is performed on gate oxides having thicknesses of over 500 Angstroms, the $N_2$ and the inert gases in general achieve the same beneficial effect, i.e. a reduction of the fixed oxide charge.

However, it has been discovered by the inventors that for thin oxide gate dielectric layers, the choice of an annealing ambient is critical.

As will be explained in more detail hereinafter, and as illustrated by experimental evidence, annealing an $SiO_2$ gate layer of a thickness less than 500 Angstroms that is formed on a silicon body, and particularly in the lower ranges of less than 300 Angstroms, does not reduce the surface state charge, and may actually increase it. However, if such oxide gate layers of thicknesses less than 500 Angstroms are annealed in an argon ambient, the surface state charge is permanently decreased. Thus, the choice of annealing ambients is critical for the aforementioned structures. This is not apparent from the prior art teaching, since it indicates that for anneal purposes $N_2$ and inert gases are interchangeable.

It is theorized that annealing thermal silicon oxide gate dielectric layers in either $N_2$ or argon ambients establishes a relatively uniform oxygen concentration in the oxide, which results in an improved stoichiometric balance between the oxygen and the silicon. This results in a decrease or elimination of the fixed oxide charge. However, what was not realized in the prior art is that annealing in nitrogen introduces a nitrogen concentration gradient in the oxide. It is theorized that when the concentration of nitrogen at the interface becomes significant, a silicon nitride layer is formed at the interface which also causes charges to appear. These generated charges perhaps form in much the same manner that charges were formed by the oxygen-silicon atom stoichiometric unbalanced condition. When the thickness of the gate oxide is greater than 500 Angstroms, the fixed charges caused by the unbalanced stoichiometric oxygen and silicon atoms at the interface is eliminated well before the generated charges are established by the nitrogen diffusion through the oxide. However, as the gate oxide thickness is decreased, the interval between the elimination of the fixed oxide charges and the subsequent establishment of the generated charges becomes less. At some thickness, the generated charges are established before the initial fixed oxide charges are eliminated. At this thickness, fixed oxide charges cannot be eliminated in a nitrogen ambient anneal. At somwhat greater oxide thicknesses, the anneal time in $N_2$ is critical, i.e. the anneal must be terminated at the proper time after the initial fixed charge is eliminated but before the generated charge appears. This criticality introduces additional uncertainties which lead to reduced yields. However, an inert gas ambient does not cause generated charges as does nitrogen. Thus, for very thin gate oxide films, only the use of an inert gas ambient is practical.

In FIG. 1 there is depicted a cross-sectional view of a typical field effect transistor device to which the annealing process is particularly applicable. The transistor includes a monocrystalline semiconductor body 10 provided with a source region 12 and a drain region 14 in spaced relation. A relatively thick field dielectric layer 16 is provided in the non-active device areas. The gate dielectric layer 18 overlying the area between source and drain regions 14 separates the conductive gate electrode 20 from the semiconductor body 10. Source and drain electrodes 22 and 24 of conductive material make ohmic contact to source and drain regions 12 and 14. A passivating layer 26 covers the conductive metallurgy of the device. Conduction between regions 12 and 14 occurs through the surface adjacent channel between the two regions and is modulated by a potential applied to the gate electrode 20. In the fabrication of field effect transistors, surface phenomenon are exceedingly important. It is therefore essential that the quality of the insulation film 18 covering the surface adjacent the source and drain regions be very high. At the same time, it is essential that the thickness of the film 18 be relatively thin in order to provide a relatively low threshold voltage. Further, any charges existing in the dielectric layer 18 will effect the stability of the threshold voltage. The aforementioned fixed oxide charge causes by charges near the substrate oxide interface may, if sufficiently high, cause an N-channel between the source and drain in an N-channel device. These charges have been removed in the past by annealing for a suitable time at a suitable temperature in a nitrogen atmosphere. When the dielectric layer 18 is relatively thin, i.e. less than 500 Angstroms, annealing in a nitrogen atmosphere will either (1) not reduce the fixed oxide charges or (2) if the fixed oxide charges are reduced, further annealing will result in the appearance of generated charges making the anneal time critical.

The following experiments are shown for the sake of better understanding of the invention.

EXAMPLE I

In this experiment, a 100 Angstrom thickness thermal oxide layer was annealed in a nitrogen environment at different times and temperatures to illustrate the inability of a nitrogen anneal to maintain a low surface charge density. It also illustrates the occurrence of generated charges upon further annealing in nitrogen. Two sets of silicon wafers having a <100> crystal orientation, including a P-type background doping, resulting in a resistivity of 2 ohm/cm, were cleaned to remove contaminants and native oxides. The cleaning consisted of dip etching in an aqueous HF solution, followed by immersion in hot aqueous $NH_4OH + H_2O_2$ solution, followed by immersion in hot aqueous $HCl + H_2O_2$ solution, followed by rinsing in high resistivity water.

After the wafers were dried, the surfaces were oxidized in dry oxygen at a temperature of 925°C, causing a 100 Angstrom thickness layer of thermal $SiO_2$ to be grown. A control wafer was set aside and four wafers annealed at 1050°C in a nitrogen ambient at differing times, namely a third of one hour, one hour, three hours, and sixteen hours. A second set of three wafers was annealed at 1000°C for one-third hour, one-half hour and one hour. After cooling, on each of the wafers, a plurality of 20 mil diameter dots of aluminum was deposited through a metal mask by evaporation. The aluminum layer had a thickness of approximately 5,000 Angstroms. Also, a blanket layer of aluminum was deposited on the back side of each of the wafers. The wafers were than given a postmetallization anneal at 400°C for 15 minutes in a nitrogen atmosphere. The nature of the fixed oxide charge associated with the thermally oxidized silicon on each wafer was then measured using conventional capacitance-voltage measurements in the known manner, utilizing the expression $$\frac{Q_s}{q} = \frac{C_{ox}}{q}(-V_{FB} + \phi_{MS})$$

where $Q_s$ is the surface charge density in charges/cm$^2$, $q$ is the charge of electron equal to $1.6 \times 10^{-19}$ coulombs, $C_{ox}$ is the oxide capacitance in farads/cm$^2$, and $\phi_{MS}$ is the difference in the work function of the Al metal and silicon which is equal to a −0.80v for this particular 2ohm-cm, P-type silicon. The technique for measuring the surface charge by capacitance-voltage measurements is well known in the art and described in "Characteristics of Solid State Charge of Thermally Oxidized Silicon" by Deal, Sklar, Grove, and Snow, in *Solid State Science*, Vol. 114, No. 3, March 1967, pp. 266–273. The results are depicted in the following table:

100A $SiO_2$ - $N_2$ Ambient - 1050°C

| Anneal Time | | $V_{FB}$ | $Q_s/q$ |
|---|---|---|---|
| 0 | | −1.06V | 5.6 × $10^{11}$/cm² |
| 0.33 | hr | −0.88V | 1.7 × $10^{11}$ |
| 1.0 | hr | −0.89V | 1.9 × $10^{11}$ |
| 3.0 | hr. | −1.00V | 4.3 × $10^{11}$ |
| 16.0 | hr. | −1.22V | 9.1 × $10^{11}$ |

100A $SiO_2$ - $N_2$ Ambient - 1000°C

| Anneal Time | | $V_{FB}$ | $Q_s/q$ |
|---|---|---|---|
| 0 | | −1.06V | 5.6 × $10^{11}$/cm² |
| 0.33 | hr. | −0.81V | 0.2 × $10^{11}$ |
| 0.50 | hr. | −0.82V | 0.50 × $10^{11}$ |
| 1.0 | hr. | −0.87V | 1.4 × $10^{11}$ |

Figure 2:
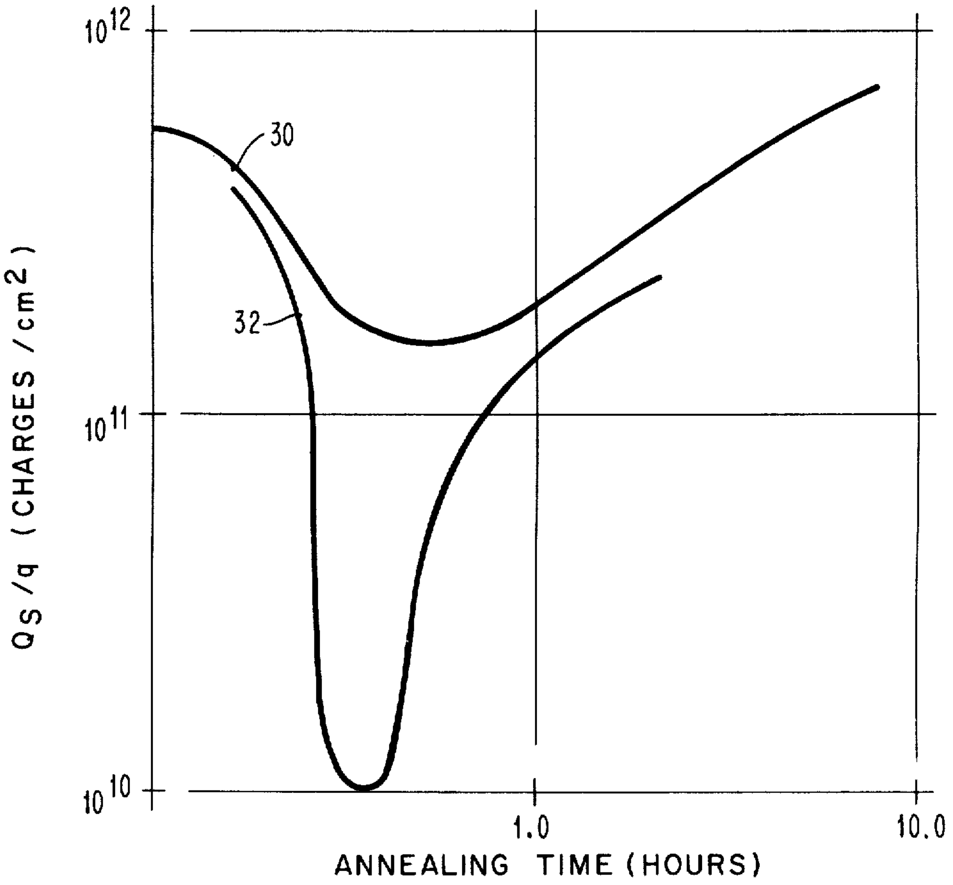
FIG. 2 is a plot of surface charge versus time for a nitrogen anneal of a 100 Angstrom thickness film where the temperature was varied.

The above data has been plotted in FIG. 2 of the drawings. Curve 30 indicates that with an annealing temperature in nitrogen at 1,050°C, a 100 Angstrom $SiO_2$ film shows an increase in fixed oxide charge followed by the appearance of generated charge. Curve 32 indicates that the same film when annealed at 1,000°C loses its fixed charge but almost immediately exhibits generated charge upon further annealing. This example proves that a nitrogen anneal of thin $SiO_2$ films does not satisfactorily maintain a minimum surface charge.

EXAMPLE II

In this example, a comparison was made of the fixed oxide charge reduction results of annealing various thicknesses of thermal oxide in nitrogen, and in argon for varying times. Again, a plurality of wafers was selected, cleaned and oxidized in the manner described in Example I. However, different thicknesses of thermal oxide layers were formed by exposing the wafers to the oxygen environment at 925°C for different times. Films having a thickness of 100, 150, 250 and 500 Angstroms were prepared and annealed. Each series of wafers was annealed in $N_2$ for 0.33 hours, one hour, three hours, and sixteen hours. Similar wafers were prepared with 150 Angstroms thickness films, 250 Angstroms films, and 500 Angstroms films which were annealed in argon at a temperature of 1050°C. After metallization, which was described previously, capacitance voltage measurements were made to determine the surface charge in the respective films. The following tables represent an average of the values experimentally obtained for each of the aforedescribed series.

100A $SiO_2$ - $N_2$ Ambient - 1050°C

| Anneal Time | | $V_{FB}$ | $Q_s/q$ |
|---|---|---|---|
| 0 | | −1.06V | 5.6 × $10^{11}$/cm² |
| 0.33 | hr. | −0.88V | 1.7 × $10^{11}$ |
| 1.0 | hr. | −0.89V | 1.9 × $10^{11}$ |
| 3.0 | hr. | −1.00V | 4.3 × $10^{11}$ |
| 16.0 | hr. | −1.22V | 9.1 × $10^{11}$ |

150A $SiO_2$ - $N_2$ Ambient - 1050°C

| Anneal Time | | $V_{FB}$ | $Q_s/q$ |
|---|---|---|---|
| 0 | | −1.01V | 3.0 × $10^{11}$/cm² |
| 0.33 | hr. | −0.83V | 0.4 × $10^{11}$ |
| 1.0 | hr. | −0.82V | 0.3 × $10^{11}$ |
| 3.0 | hr. | −0.89V | 1.3 × $10^{11}$ |
| 16.0 | hr. | −1.02V | 3.2 × $10^{11}$ |

250A $SiO_2$ - $N_2$ Ambient - 1050°C

| Anneal Time | | $V_{FB}$ | $Q_s/q$ |
|---|---|---|---|
| 0 | | −1.02V | 2.5 × $10^{11}$ |
| 0.33 | hr. | −0.83V | 0.3 × $10^{11}$ |
| 1.0 | hr. | −0.82V | 0.2 × $10^{11}$ |

-continued

100A $SiO_2$ - $N_2$ Ambient - 1050°C

| Anneal Time | | $V_{FB}$ | $Q_s/q$ |
|---|---|---|---|
| 3.0 | hr. | −0.92V | 1.0 × $10^{11}$ |
| 16.0 | hr. | −0.96V | 1.4 × $10^{11}$ |

500A $SiO_2$ - $N_2$ Ambient - 1050°C

| Anneal Time | | $V_{FB}$ | $Q_s/q$ |
|---|---|---|---|
| 0 | | −1.06V | 1.8 × $10^{11}$ |
| 0.33 | hr. | −0.83V | 0.2 × $10^{11}$ |
| 1.0 | hr. | −0.83V | 0.2 × $10^{11}$ |
| 3.0 | hr. | −0.83V | 0.2 × $10^{11}$ |
| 16.0 | hr. | −0.93V | 0.9 × $10^{11}$ |
| 72.0 | hr. | −1.10V | 2.1 × $10^{11}$ |

150A $SiO_2$ - Argon Ambient - 1050°C

| Anneal Time | | | $V_{FB}$ | | $Q_s/q$ |
|---|---|---|---|---|---|
| 0 | | | −1.01V | | 3.0 × $10^{11}$/cm² |
| 0.33 | hr. | ~ | −0.81V | ~ | 0.2 × $10^{11}$/cm² |
| 1.0 | hr. | ~ | −0.81V | ~ | 0.2 × $10^{11}$/cm² |
| 3.0 | hr. | ~ | −0.81V | ~ | 0.2 × $10^{11}$/cm² |
| 16.0 | hr. | ~ | −0.81V | ~ | 0.2 × $10^{11}$/cm² |

250A $SiO_2$ - Argon Ambient - 1050°C

| Anneal Time | | | $V_{FB}$ | $Q_s/q$ |
|---|---|---|---|---|
| 0 | | | −1.02V | 2.5 × $10^{11}$ |
| 0.33 | hr. | ~ | −0.81V | 0.2 × $10^{11}$ |
| 1.0 | hr. | ~ | −0.81V | 0.2 × $10^{11}$ |
| 3.0 | hr. | ~ | −0.81V | 0.2 × $10^{11}$ |
| 16.0 | hr. | ~ | −0.81V | 0.2 × $10^{11}$ |

500A $SiO_2$ - Argon Ambient - 1050°C

| Anneal Time | | | $V_{FB}$ | | $Q_s/q$ |
|---|---|---|---|---|---|
| 0 | | | −1.06V | | 1.8 × $10^{11}$ |
| 0.33 | hr. | ~ | −0.82V | ~ | 0.1 × $10^{11}$ |
| 1.0 | hr. | ~ | −0.82V | ~ | 0.1 × $10^{11}$ |
| 3.0 | hr. | ~ | −0.82V | ~ | 0.1 × $10^{11}$ |
| 16.0 | hr. | ~ | −0.82V | ~ | 0.1 × $10^{11}$ |

Figure 3:
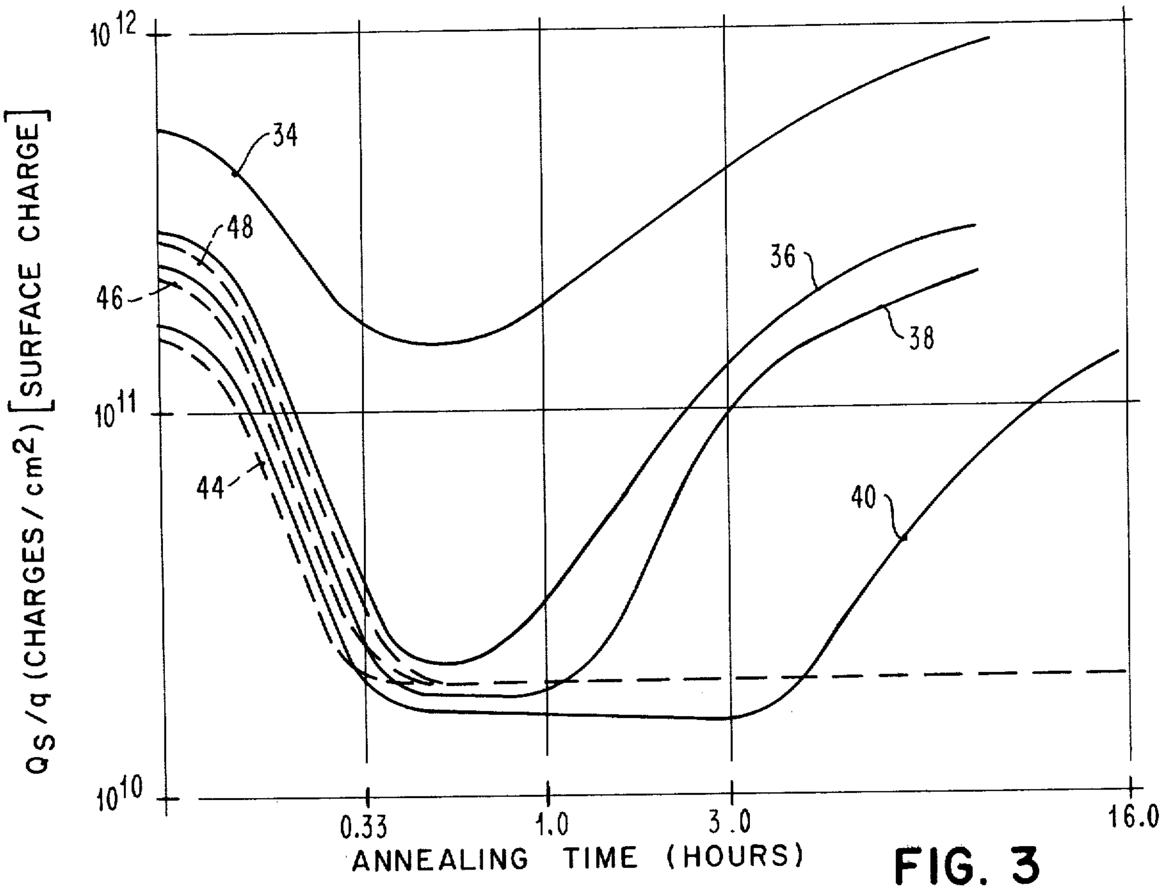
FIG. 3 is a plot of surface charge versus annealing time for a series of oxide films annealed in nitrogen and argon ambients.
Figure 4:
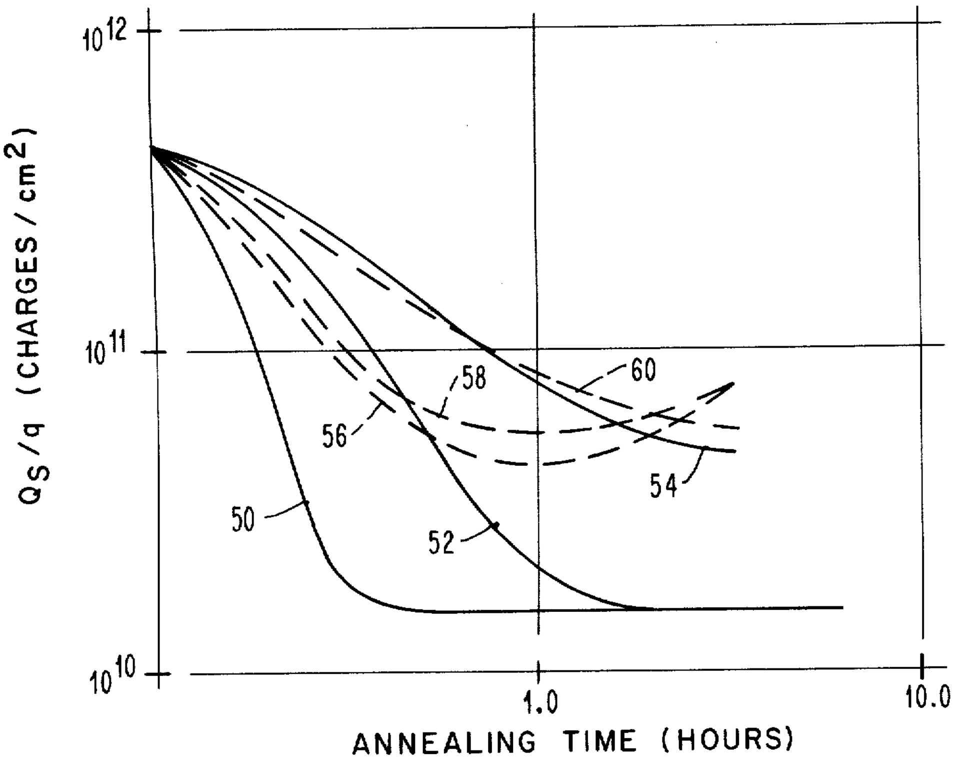
FIG. 4 is a plot of surface charge versus time comparing annealing of argon with the annealing in a nitrogen ambient at various temperatures.

The results are graphically depicted in FIG. 3 of the drawings. Curves 34, 36, 38 and 40 graphically depict the change in surface charge of the series of thermal oxide layers annealed in a nitrogen ambient. Note that curve 34 indicates that the surface charge was never eliminated although an initial decline was obtained. The generated charge increased with increased annealing time after the initial fixed charge decrease. In curves 36, 38 and 40 for greater oxide thicknesses, the fixed charge was reduced but charge was generated upon further annealing. Numerals 44, 46 and 48 depict curves of surface charge of a series of oxide layers annealed in an argon atmosphere. Note that in all cases, the fixed charge was removed and no charge was generated upon further annealing as was the case with the nitrogen anneal. This points out the non-criticality of the annealing time when utilizing an argon atmosphere for removing fixed charge.

EXAMPLE III

In this example, a plurality of oxide films on silicon wafers having uniform thicknesses of 200 Angstroms were annealed at differing temperatures in both an argon atmosphere and a nitrogen atmosphere and the results tabulated and graphed. A plurality of silicon wafers was selected as described in Example I, cleaned, dried, and thermal oxide layers each having a thickness of 200 Angstroms grown thereon in an oxygen atmosphere at a temperature of 925°C. After the wafers were cooled, three different sets of wafers were exposed to an $N_2$ atmosphere at 875°C, 1,000°C, and 1,050°C for varying times. A similar procedure was followed with a second set of wafers, except that the environment was argon. Following the anneal, the wafers were metallized with a plurality of aluminum dots and capacitance voltage measurements made on each. The following table depicts the average values of the surface charge at the $SiO_2$—Si interface of the wafers at each anneal time.

| 200A $SiO_2$ - $N_2$ Ambient - 875°C | | |
|---|---|---|
| Anneal Time | $V_{FB}$ | $Q_s/q$ |
| 0 | −1.12V | $3.5 \times 10^{11}/cm^2$ |
| 0.33 hr. | −0.96V | $1.7 \times 10^{11}$ |
| 1.0 hr. | −0.88V | $0.85 \times 10^{11}$ |
| 3.0 hr. | −0.85V | $0.6 \times 10^{11}$ |

| 200A $SiO_2$ - $N_2$ Ambient - 1000°C | | |
|---|---|---|
| Anneal Time | $V_{FB}$ | $Q_s/q$ |
| 0 | −1.12V | $3.5 \times 10^{11}/cm^2$ |
| 0.33 hr. | −0.87V | $0.8 \times 10^{11}$ |
| 1.0 hr. | −0.85V | $0.5 \times 10^{11}$ |
| 3.0 hr. | −0.86V | $0.7 \times 10^{11}$ |

| 200A $SiO_2$ - $N_2$ Ambient - 1050°C | | |
|---|---|---|
| Anneal Time | $V_{FB}$ | $Q_s/q$ |
| 0 | −1.12V | $3.5 \times 10^{11}/cm^2$ |
| 0.33 hr. | −0.88V | $0.9 \times 10^{11}$ |
| 1.0 hr. | −0.86V | $0.6 \times 10^{11}$ |
| 3.0 hr. | −0.86V | $0.7 \times 10^{11}$ |

| 200A $SiO_2$ - Argon Ambient - 875°C | | |
|---|---|---|
| Anneal Time | $V_{FB}$ | $Q_s/q$ |
| 0 | −1.12V | $3.5 \times 10^{11}/cm^2$ |
| 0.33 hr. | −1.00V | $2.1 \times 10^{11}$ |
| 1.0 hr. | −0.86V | $0.7 \times 10^{11}$ |

| 200A $SiO_2$ - Argon Ambient - 1000°C | | |
|---|---|---|
| Anneal Time | $V_{FB}$ | $Q_s/q$ |
| 0 | −1.12V | $3.5 \times 10^{11}/cm^2$ |
| 0.33 hr. | −0.85V | $0.5 \times 10^{11}$ |
| 1.0 hr. | −0.84V | $0.4 \times 10^{11}$ |
| 3.0 hr. | −0.82V | $0.2 \times 10^{11}$ |

| 200A $SiO_2$ - Argon Ambient - 1050°C | | |
|---|---|---|
| Anneal Time | $V_{FB}$ | $Q_s/q$ |
| 0 | −1.12V | $3.5 \times 10^{11}/cm^2$ |
| 0.33 hr. | −0.82V | $0.2 \times 10^{11}$ |
| 1.0 hr. | −0.82V | $0.2 \times 10^{11}$ |
| 3.0 hr. | −0.82V | $0.2 \times 10^{11}$ |

Note that curves 50 and 52 for the argon anneal at temperatures 1,050°and 1,000°C indicate a removal of the fixed oxide charge from the 200 Angstroms thick oxide films to a relatively low level. In comparison, note that curves 56 and 58 for the oxide films annealed in $N_2$ at 1,050°and 1,000°C indicated generation of charge after incomplete reduction of the fixed oxide charge. At anneal temperatures of 875°C in nitrogen (curve 60) and in argon (curve 54), incomplete reduction of the fixed oxide charge without appearance of generated charge was observed. In this example, the anneal was carried out only to times of three hours.

EXAMPLE IV

In this example, the presence of a chemical change in the interface zone following a nitrogen anneal was detected by a comparison of $SiO_2$ films annealed in nitrogen and a film that was not annealed. The detection was made by comparing the respective film's resistance to reoxidation. A plurality of silicon wafers was selected and cleaned as described in Example I. 150 Angstroms of thermal $SiO_2$ was grown on the surface of the wafers. One set of wafers was not annealed while five sets were annealed in a nitrogen atmosphere for varying times at 1,050°C. The thicknesses of the initial films were carefully measured and all of the wafers except the control wafer set were placed in an $O_2$ atmosphere for three minutes at 1,050°C. After cooling the wafers, the total thickness of each film was carefully measured. The results are set forth in the following table:

Barrier to Reoxidation as Function of Long Term Anneal

| Sample | | Initial $O_2$ Thickness | 3 Min. $O_2$ 1050°C | Final $O_2$ Thickness |
|---|---|---|---|---|
| 0 | hr-$N_2$ Anneal-1050°C | 150A | — | 150A |
| 0.33 | " | " | yes | 210A |
| 1.0 | " | " | yes | 210A |
| 3.0 | " | " | yes | 210A |
| 16.0 | " | " | yes | 155A |
| 72.0 | " | " | yes | 155A |

Note that the sample annealed at 0.33 hours had an initial oxide thickness of 150 Angstroms but following the second oxidation, the total thickness was 210 Angstroms. In contrast, note that the sample annealed at 72 hours, which also had an initial thickness of 150 Angstroms, had a final thickness of only 155 Angstroms. This indicates that the initial 150 Angstroms thickness of oxide was somehow affected such that the longer anneal formed a barrier to oxidation.

Four sets of wafers were oxidized to form an oxide having a thickness of 120 Angstroms. After measurement of the oxide thicknesses, each set was annealed at 1,050°C. The annealing ambient was either nitrogen or argon, and the anneal time was either 0.33 hours or 16 hours. After annealing, each set was exposed to an oxygen ambient for two minutes at 1,050°C. The thicknesses of each oxide film were re-measured. The following table sets forth the data:

Reoxidation

| Sample | | Initial $O_2$ Thickness | 2 Min. $O_2$ 1050°C | Final $O_2$ Thickness |
|---|---|---|---|---|
| 0.33 | hr-$N_2$ Anneal-1050°C | 120A | yes | 170A |
| 16.0 | " | " | yes | 123A |
| 0.33 | hr-Ar Anneal-1050°C | 120A | yes | 170A |
| 16.0 | " | " | yes | 170A |

Note that the final oxide thickness, i.e. an increase of approximately 50 Angstroms, was the same for the $N_2$ anneal at 0.33 hr. and the Ar anneal at 0.33 hr. and 16 hours. However, the final oxide thickness was substantially unchanged after annealing for 16 hours in $N_2$ and subsequently reoxidizing. This indicates that a long $N_2$ anneal forms a barrier to oxidation, whereas a long Ar anneal does not.

EXAMPLE V

In this example, the effect of a nitrogen anneal on a thin dielectric as it affects the etch rate of the oxide is explored. A plurality of wafers was selected and cleaned as described in Example I. 100 Angstroms oxide films was formed on the wafers and the thickness carefully measured. A first set of wafers received no anneal and served as control wafers. A second set of wafers was annealed in a nitrogen atmosphere for a time of 336 hours at a temperature of 1,000°C. A third set of wafers was annealed in an argon atmosphere at a temperature of 1,000°C for 336 hours. After the anneal, each of the wafers was inserted in a P etchant for a measured amount of time, removed, and the thickness carefully measured. The procedure was continued until the entire thickness of the oxide layer was removed. Knowing the differences in thickness and the etch time, the etch rate was calculated at various points through the oxide layer. The results were compared to determine if the etch rate remained the same throughout the thickness of each of the layers. In the control wafer, where the oxide layer received no anneal, the etch rate was a constant 2.7 Angstroms per second throughout. In the second set, consisting of oxide layers having been annealed in nitrogen, the initial etch rate at the top surface of the film was approximately 2.5 Angstroms per second, whereas the final etch rate adjacent the interface was 0.24 Angstroms per second. The etch rate remained relatively constant through approximately three-fourths of the thickness of the film but slowed appreciably as the etchant approached the interface. This indicates that the nitrogen anneal affected the oxide film adjacent the interface by changing the nature of the film. In the third set consisting of oxide films annealed in argon, the etch rate through the film was a relatively constant 2.7 Angstroms per second, the same as the control wafer. The etch rate remained constant throughout the thickness of the film.

EXAMPLE VI

In this example, the change of surface state charges of oxide films annealed in a helium ambient at 1,000°C was explored. Two sets of wafers were selected and cleaned as described in Example I. On the first set of wafers, an $SiO_2$ thickness of 230 Angstroms was grown. On the second set, the oxide thickness was 400 Angstroms. Each of the sets of wafers was annealed in helium ambient at 1,000°C for varying lengths of time and the surface state charge measured and tabulated. The results are depicted below. As the results indicate, the fixed oxide charge in the film was reduced by annealing in the helium ambient and there was no significant charge generation upon further annealing. The results of annealing in a helium ambient compare closely to those obtained by annealing in an argon ambient.

230A $SiO_2$ - He Ambient - 1000°C

| Anneal Time | $V_{FB}$ | $Q_s/q$ |
|---|---|---|
| 0 | −1.12V | $3.2 \times 10^{11}/cm^2$ |
| 0.5 hr. | −0.80V | $< 10^{10}$ |
| 2.0 hr. | −0.81V | $.1 \times 10^{11}$ |
| 5.0 hr. | −0.83V | $.3 \times 10^{11}$ |
| 11.0 hr. | −0.83V | $.3 \times 10^{11}$ |

400A $SiO_2$ - He Ambient - 1000°C

| Anneal Time | $V_{FB}$ | $Q_s/q$ |
|---|---|---|
| 0 | −1.24V | $2.4 \times 10^{11}$ |
| 0.5 hr. | −0.85V | $0.3 \times 10^{11}$ |
| 2.0 hr. | −0.81V | $0.1 \times 10^{11}$ |
| 5.0 hr. | −0.86V | $0.3 \times 10^{11}$ |
| 11.0 hr. | −0.85V | $0.3 \times 10^{11}$ |

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method of fabricating and stabilizing a gate dielectric layer for MOS devices to reduce the fixed oxide charge in the gate dielectric layer without degrading the layer comprising:

forming a layer which includes at least a layer of silicon oxide of a thickness less than 500 Angstroms over at least the gate region by thermal oxidation of the monocrystalline silicon device substrate, annealing the substrate in an atmosphere of a gas selected from the group consisting of He, Ne, Ar, Kr and Xe, at a temperature of at least 900°C for at least ten minutes.

2. The method of claim 1 wherein said gate dielectric layer has a thickness in the range of 100 to 300 Angstroms.

3. The method of claim 1 wherein the annealing temperature is in the range of 900°to 1,100°C.

4. The method of claim 1 wherein the annealing time is in the range of 0.15 to 100 hours.

5. The method of claim 3 wherein the annealing time is in the range of 0.25 to 24 hours, with a temperature in the range of 950°to 1,050°C.

6. The method of claim 2 wherein said annealing atmosphere is argon.

7. The method of claim 5 wherein said annealing atmosphere is argon.

8. The method of claim 1 wherein said annealing time in the atmosphere of argon is in the range of 1 to 4 hours.

* * * * *